US010712392B2

(12) United States Patent
Swan et al.

(10) Patent No.: US 10,712,392 B2
(45) Date of Patent: Jul. 14, 2020

(54) SYSTEMS AND METHODS FOR DETERMINING STATE-OF-CHARGE USING TAFEL SLOPE

(71) Applicant: CHARGED ENGINEERING INC., Cole Harbour (CA)

(72) Inventors: Lukas Swan, Cole Harbour (CA); Christopher White, Deer Lake (NL)

(73) Assignee: Charged Engineering Inc., Cole Harbour (CA)

( * ) Notice: Subject to any disclaimer, the term of this patent is extended or adjusted under 35 U.S.C. 154(b) by 36 days.

(21) Appl. No.: 16/097,200

(22) PCT Filed: Apr. 27, 2017

(86) PCT No.: PCT/CA2017/050514
§ 371 (c)(1),
(2) Date: Oct. 26, 2018

(87) PCT Pub. No.: WO2017/185181
PCT Pub. Date: Nov. 2, 2017

(65) Prior Publication Data
US 2019/0137569 A1 May 9, 2019

Related U.S. Application Data

(60) Provisional application No. 62/328,064, filed on Apr. 27, 2016.

(51) Int. Cl.
*G01R 31/367* (2019.01)
*H01M 10/44* (2006.01)
(Continued)

(52) U.S. Cl.
CPC .......... *G01R 31/367* (2019.01); *G01R 31/374* (2019.01); *G01R 31/389* (2019.01); *H01M 10/44* (2013.01); *H01M 10/48* (2013.01)

(58) Field of Classification Search
CPC .. G01R 31/367; G01R 31/389; G01R 31/374; H01M 10/44; H01M 10/48
See application file for complete search history.

(56) References Cited

U.S. PATENT DOCUMENTS

| 5,198,743 A | 3/1993 | McClure et al. |
| 2003/0001581 A1* | 1/2003 | Laig-Horstebrock ....................... G01R 31/367 324/433 |

(Continued)

FOREIGN PATENT DOCUMENTS

WO    2017024411 A1    2/2017

OTHER PUBLICATIONS

Shiao et al. "Electrochemistry theorem based state-of-charge estimation of the lead acid batteries for electric vehicles." WSEAS Transactions on Systems 7.10 (2008): 1092-1103.
(Continued)

*Primary Examiner* — Nha T Nguyen
(74) *Attorney, Agent, or Firm* — Christopher J. Barden

(57) ABSTRACT

Apparatus, systems, and methods for battery charging and formation are disclosed herein that charge, or discharge, one or more batteries and stop charging or discharging each battery once it has reached a desired state-of-charge, as determined by comparing calculated Tafel slope to a reference Tafel slope for the battery. Computer-readable instructions and/or hardware are also provided for installation upon a previously existing battery charging system or battery discharging system.

20 Claims, 15 Drawing Sheets

(51) Int. Cl.
*H01M 10/48* (2006.01)
*G01R 31/389* (2019.01)
*G01R 31/374* (2019.01)

(56) References Cited

U.S. PATENT DOCUMENTS

| | | | |
|---|---|---|---|
| 2007/0080668 A1* | 4/2007 | Al-Anbuky | G01R 31/3835 |
| | | | 320/136 |
| 2011/0264381 A1 | 10/2011 | Gering | |
| 2012/0145564 A1* | 6/2012 | Yamazaki | H01M 8/04753 |
| | | | 205/790.5 |
| 2013/0207671 A1* | 8/2013 | Torai | G01R 27/02 |
| | | | 324/649 |
| 2015/0048778 A1 | 2/2015 | Davidson | |

OTHER PUBLICATIONS

Hunter et al., "VRLA Battery Virtual Reference Electrode: Battery Float Charge Analysis" in IEEE Transactions on Energy Conversion, vol. 23, No. 3, pp. 879-886, Sep. 2008.

White et al., "Evolution of internal resistance during formation of flooded lead-acid batteries", Journal of Power Sources, vol. 327, 2016, pp. 160-170.

International Search Report for PCT/CA2016/050951, dated Nov. 1, 2016 (applicant's co-pending application).

\* cited by examiner

SYSTEMS AND METHODS FOR DETERMINING STATE-OF-CHARGE USING TAFEL SLOPE

CROSS-REFERENCE TO RELATED APPLICATIONS

This application is a national phase application under 35 U.S.C. § 371 of International Application Ser. No. PCT/CA2017/050514, filed Apr. 27, 2017, which claims the benefit of U.S. Provisional Application Ser. No. 62/328,064, filed Apr. 27, 2016, the contents of which are hereby incorporated by reference.

BACKGROUND

Batteries are important energy storage technologies in many industries and community settings. Users rely on batteries for reliable electrical power, and so for planning purposes they wish to know how much usage any particular battery may have; broadly speaking this concept is known as "state-of-charge".

Manufacturing firms also care about state-of-charge, for example, in the development and deployment of battery-containing products that include state-of-charge indicators as a feature. Battery manufacturers are particularly concerned with establishing how fully charged a battery is before it is shipped, so that the customer can expect consistent high-level performance upon delivery. For example, the lead-acid battery is an electrochemical energy storage technology commonly used in systems all over the world, including backup power, electric vehicles, ignition systems, and renewable energy. The manufacturing process of these batteries involves a time and energy-intensive step known as 'formation', which electrochemically activates the batteries through a long electrical charge. In-situ measurement of the level of completeness of this charging process would provide more precise control over formation.

The Tafel equation is shown in Eq. (1), which describes the overvoltage ($U - U^0$) of an electrochemical reaction generating an electric current. This equation breaks down at small overvoltages but holds true otherwise:

$$U - U^0 = U'_{Tafel} \log\left(\frac{I}{I^0}\right) \tag{1}$$

In Eq. (1), $I^0$ is the exchange current at the equilibrium voltage ($U^0$) and $U'_{Tafel}$ is the Tafel slope. The Tafel slope is dependent on the gas constant (R), the temperature (T), the charge-transfer coefficient ($\alpha$), the number of charges transferred (n), and the Faraday constant (F), as shown in Eq. (2). Values for $U'_{Tafel}$ have been established for many electrochemical reactions:

$$U'_{Tafel} = \frac{RT}{\alpha nF} \tag{2}$$

In a battery, there is an unavoidable ohmic voltage drop whenever current is flowing, which is separate from the electrochemical overvoltage. This ohmic voltage drop is directly proportional to the current (I) and the ohmic resistance ($R_\Omega$). Thus for a battery, Eq. (1) can be expressed as Eq. (3):

$$U - U^0 - IR_\Omega = U'_{Tafel} \log\left(\frac{I}{I^0}\right) \tag{3}$$

The charging or discharging of a battery may also give rise to additional overpotentials from concentration gradients and crystallization processes, which can be grouped together as a "non-electrochemical overpotential" ($\eta$). This additional overpotential is included in Eq. (4):

$$U - U^0 - IR_\Omega - \eta = U'_{Tafel} \log\left(\frac{I}{I^0}\right) \tag{4}$$

If the goal is to determine Tafel slope for a given battery, then Eq. (4) can be rearranged into Eq. (5):

$$U'_{Tafel} = \frac{U - U^0 - IR_\Omega - \eta}{\log I - \log I^0} \tag{5}$$

In practice, U, I, and $R_\Omega$ can be measured during battery operation, but accurate determination of $U^0$, $I^0$, and $\eta$ during operation is typically done through advanced modelling techniques or laborious scientific experimentations that are impractical for real-world applications.

Information regarding the state-of-charge of a battery, such as a lead-acid battery, is attainable using a variety of indicators including deep discharges, coulombic counting, electrolyte density, open-circuit voltage, loading response, ohmic resistance, electrochemical impedance spectroscopy, as well as modelling techniques such as Kalman filters, neural networks, and fuzzy logic. However, each of these methods has shortcomings of being too impractical, too inaccurate/unreliable, or too complex/expensive. There remains a need for a simple and accurate method for measurement of state-of-charge, providing value for both formation at the manufacturer and operation at the end-user.

SUMMARY

In general, in an aspect, a method of determining state-of-charge in a battery is described, the method including measuring a first electrical potential $U_x$ at an initial current state $I_x$, stepping electrical current to at least one subsequent current state $I_y$ for at least some prescribed duration of time, measuring voltages $U_x$ and $U_y$ at the corresponding current steps $I_x$ and $I_y$ respectively, determining ohmic resistance, calculating $U'_{Tafel}$ (Tafel slope) of the battery, and finally, determining that state-of-charge in the battery by comparing the measured $U'_{Tafel}$ to a predetermined target value that is characteristic of the battery at that state-of-charge. Implementations may include one or more of the following. The battery exhibits during charging or discharging at least one electrochemical main reaction system and at least one electrochemical side reaction system, and the predetermined target value of Tafel slope is approximately equal to that of a predetermined electrochemical side reaction system. The battery exhibits during charging or discharging exactly one electrochemical main reaction system and exactly one electrochemical side reaction system, and the predetermined target value of Tafel slope is approximately equal to that of the predetermined electrochemical side reaction system. The battery exhibits during charging or discharging multiple series or parallel electrochemical reaction systems, and the predetermined target value of Tafel slope is that of a predetermined electrochemical reaction system that predominates when the battery is approximately fully charged. The predetermined target value of Tafel slope is that of a predetermined electrochemical reaction system that predominates when the battery is approximately fully discharged.

In general, in an aspect, a method of determining state-of-charge in a battery is described, the method including measuring a first electrical potential $U_x$ at an initial current state $I_x$, stepping electrical current among the initial current state and at least two current states $I_y$, $I_z$ for at least some prescribed duration of time at each state, measuring voltages $U_x$, $U_y$, $U_z$ at their corresponding current steps, determining ohmic resistance, calculating $U'_{Tafel}$ (Tafel slope) of the battery, and finally, determining that state-of-charge in the battery by comparing the measured $U'_{Tafel}$ to a predetermined target value that is characteristic of the battery at that state-of-charge.

Implementations may include one or more of the following. The battery exhibits during charging or discharging at least one electrochemical main reaction system and at least one electrochemical side reaction system, and the predetermined target value of Tafel slope is approximately equal to that of a predetermined electrochemical side reaction system. The battery exhibits during charging or discharging exactly one electrochemical main reaction system and exactly one electrochemical side reaction system, and the predetermined target value of Tafel slope is approximately equal to that of a predetermined electrochemical side reaction system. The battery exhibits during charging or discharging multiple series or parallel electrochemical reaction systems, and the predetermined target value of Tafel slope is that of a predetermined electrochemical reaction system that predominates when the battery is approximately fully charged. The predetermined target value of Tafel slope is that of a predetermined electrochemical reaction system that predominates when the battery is approximately fully discharged. There is also a current state $I_4$ and corresponding voltage $U_4$ that can be used for computing Tafel slope. There is also a current state $I_5$ and corresponding voltage $U_5$ that can be used for computing Tafel slope. There is a plurality of current states and corresponding voltages that can be used for computing Tafel slope.

In general, in an aspect, a system connected to a power source for determining state-of-charge of one or more batteries is provided, each battery having a positive terminal and a negative terminal. The system includes a control module having a microprocessor and microprocessor-readable instruction code, the control module being electrically interposed between the power source and one or more output electrical components and controls flow of current to the output electrical components. Each output electrical component is electrically connected to the control module, one of the battery positive terminals of the one or more batteries, and its corresponding battery negative terminal, each forming a circuit between that component and its corresponding battery wherein there are one or more circuits. Sensors are also included that attach to each circuit, in which the sensors provide information at least indicative of voltage and current in the battery corresponding to that circuit to an analysis module, the analysis module having a microprocessor and microprocessor-readable analysis code; in which the analysis module computes the Tafel slope using two or more known commanded current flows, two or more corresponding voltages, and the ohmic resistance, and compares the Tafel slope to a predetermined target value of Tafel slope as a state-of-charge criterion.

Implementations may include one or more of the following. The system is a battery charging system, the power source charges the battery, and the state-of-charge criterion is met when the battery is approximately fully charged. The system is a battery charging system and the state-of-charge criterion is met when the Tafel slope is approximately equal to the predetermined target value of Tafel slope. The system is a battery charging system and the control module halts battery charging for a given battery upon notice from the analysis module that the state-of-charge criterion is met. The system is a battery discharging system and the state-of-charge criterion is met when the battery is approximately fully discharged. The control module and the analysis module constitute the same combined module, sharing a microprocessor that includes both instruction code and analysis code and allows for instantaneous notice as between control and analysis functions. The system also has one or more state-of-charge indicators, which may include any or all of visual, textual, and aural indicia. The state-of-charge indicator is activated once the state-of-charge criterion is met for any battery. Each state-of-charge indicator is activated once a state-of-charge criterion is met for its corresponding battery. The state-of-charge indicator is activated once a state-of-charge criterion is met for all batteries. The sensors providing information at least indicative of voltage and current in a given battery include a voltage sensor and a current sensor, and ohmic resistance is calculated using a resistance equation. Ohmic resistance is determined by use of a separate output current component capable of injecting an AC current transient or a DC current pulse transient into the battery, with sensors for measuring the applied current and resultant voltage transient, and ohmic resistance is calculated using an AC-based or DC-based resistance equation, as appropriate. Ohmic resistance can be measured from the current and voltage measurements from two or more applied current steps using an ohmic resistance approximation equation. Ohmic resistance can be determined by reference to a previously obtained value for ohmic resistance characteristic of that battery type. Once ohmic resistance is determined and current and voltage from the one or more applied current steps are measured, Tafel slope is calculated using a Tafel slope equation. Each voltage sensor is attached to each circuit between the corresponding positive battery terminal and negative battery terminal. Each current sensor is attached to each circuit between its corresponding battery and the output electrical component. Each current sensor is attached to each circuit between the corresponding negative battery terminal and the output electrical component. Each current sensor is attached to each circuit between the corresponding positive battery terminal and output electrical component. The sensors also have a temperature sensor connected to the battery, which may or may not be used to adjust calculated Tafel slope.

Implementations may also include one or more of the following. The control module has instruction code to perform one or more ohmic resistance measurement methods during a measurement interval for each battery. The resistance measurement method uses direct current (DC) current pulse, in which there is a transient change in current. The DC current pulse is performed with reference to a reference current. The DC current pulse is a current increase that is proportional to the reference current, in which the current increase can be expressed as a percentage higher than the reference current. The DC current pulse is a current decrease that is proportional to the reference current, in which the current decrease can be expressed as a percentage lower than the reference current. The DC current pulse is about 300% higher than the reference current. The DC current pulse is less than about 300% higher than the reference current. The DC current pulse is less than about 200% higher than the reference current. The DC current pulse is less than about 100% higher than the reference current. The DC current pulse is less than about 75% higher than the reference current. The DC current pulse is less than about 50% higher. The DC current pulse is less than about 25% higher. The DC current pulse is less than about 10% higher. The DC current pulse is less than 100% lower than the reference current. The DC current pulse is less than about 75% lower. The DC current pulse is less than about 50% lower. The DC current pulse is less than about 25% lower. The DC current pulse is less than about 10% lower. The DC current pulse is zero current. The DC current pulse has a preselected time-based duration prior to measuring voltage. The duration is about 10 milliseconds. The duration is about 1 millisecond. The duration is less than 1 millisecond. The ohmic resistance measurement method is alternating current (AC) current injection. The AC current injection has a frequency between about 1 Hz to about 10 kHz. The frequency is about 1 kHz. The AC current injection has a current amplitude between about 1 microampere to about 10 ampere, optionally about 100 milliampere.

Implementations may also include one or more of the following. The control module has instruction code to perform one or more Tafel slope measurement methods during a measurement interval for each battery. The Tafel slope measurement method is Tafel step. The Tafel slope measurement method is Tafel staircase. The control module has instruction code to perform a plurality of measurement intervals in a sequence for each battery. The Tafel slope measurement methods use DC current steps, in which there is a step change in current prior to measuring voltage. DC current step is performed with reference to a reference current. The step change in current is an immediate change from the reference current to the stepped current. The step change in current is accomplished gradually by ramping current from the reference current to the stepped current. The ramping from the reference current to the stepped current occurs within about 5 minutes. The DC current step is about 300% higher, less than about 300% higher, or less than about 200% higher, or less than about 100% higher, or less than about 75% higher, or less than about 50% higher, or less than about 25% higher, or less than about 10% higher than the reference current. The DC current step can be less than about 100% lower, or less than about 50% lower, or less than about 25% lower, or less than about 10% lower than the reference current. The DC current step is held for about five minutes prior to measuring voltage. The DC current step is held for between about four minutes and about five minutes. The DC current step is held for about four minutes. The DC current step is held for between about three minutes and about four minutes. The DC current step is held for about three minutes. The DC current step is held for between about two minutes and about three minutes. The DC current step is held for about two minutes. The DC current step is held for between about one minute and about two minutes. The DC current step is held for about one minute. The DC current step is held for between about 30 seconds and about one minute. The DC current step is held for about 30 seconds. The DC current step is held for at least about 10 seconds but no more than about 30 seconds. The DC current step is held for at least 1 second but no more than about 10 seconds. The amount of time for the DC current step to be held prior to measuring voltage can be predetermined for a given battery type using a measure of voltage stabilization.

Implementations may also include one or more of the following. The measurement intervals within the sequence include varying Tafel slope measurement methods and may also include one or more ohmic resistance measurement methods. The sequence is periodic. The sequence is about every 10 minutes. The sequence is about every 30 minutes. The sequence is about every hour. The sequence is about every five hours. The sequence is not periodic but is performed according to a predetermined schedule. The predetermined schedule is first sixty minutes, second ten minutes, and every five minutes thereafter until halted.

Implementations may also include one or more of the following. The analysis module has analysis code to calculate average ohmic resistance using the voltage sensor and the current sensor one or more times during a measurement interval. The analysis module also has analysis code to calculate average Tafel slope using the voltage sensor and the current sensor one or more times during a measurement interval. The analysis module has analysis code to combine results of one or more Tafel slope measurement methods or to combine results of one or more ohmic resistance measurement methods or both, performed during a measurement interval. The analysis module has analysis code to compute an average Tafel slope using at least two measurement intervals in the sequence. The analysis module has analysis code to compare average Tafel slope to a predetermined Tafel slope target that is characteristic of the battery at a predetermined state-of-charge.

In general, in an aspect, a method of charging or discharging a battery is described, the method including charging or discharging of a battery using the one of the systems described herein. Implementations may include one or more of the following. The battery is lead-acid in design. The battery is nickel-metal-hydride in design.

In general, in an aspect, a method of charging or discharging a battery is described, the method including using the instruction code and analysis code described herein upon a microprocessor in a battery charging or discharging system.

In general, in an aspect, a non-transitory computer readable medium is described, the medium being loadable upon a state-of-charge system to perform methods described herein.

These and other features and aspects, and combinations of them, may be expressed as methods, systems, components, means and steps for performing functions, apparatus, software, computer-readable media, articles of manufacture, compositions of matter, and in other ways.

Other advantages and features will become apparent from the following description and claims.

DESCRIPTION

Figure 7:
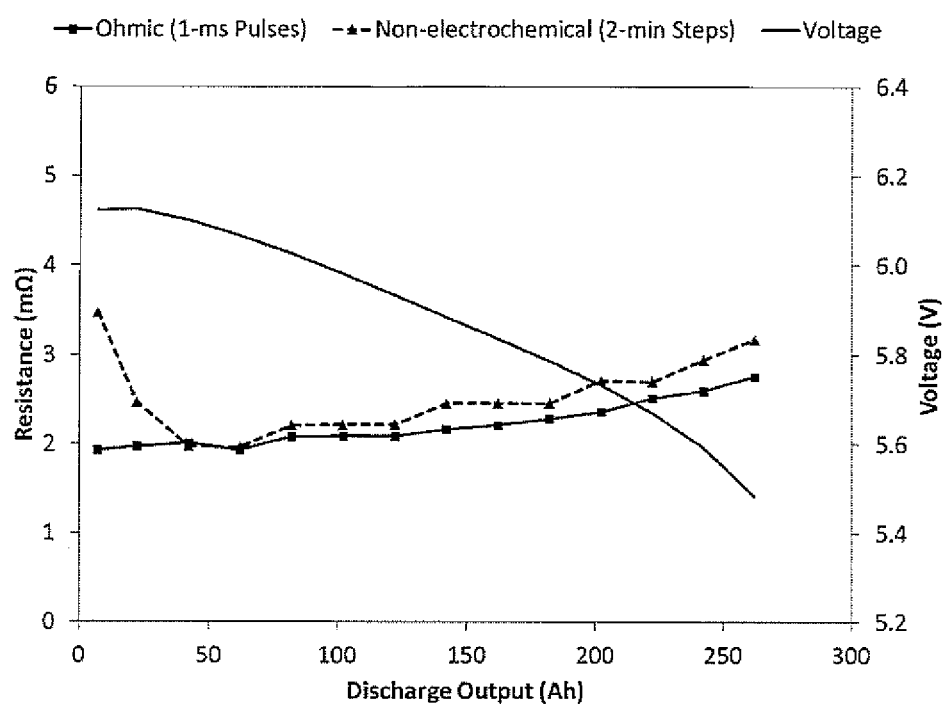
Figure 8:
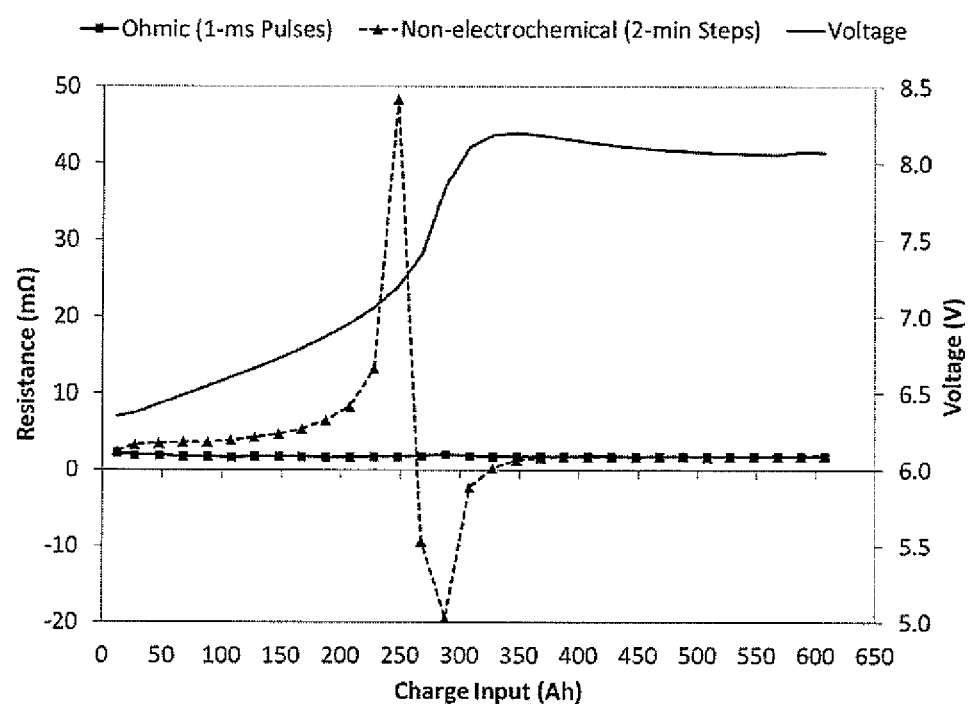
Figure 9:
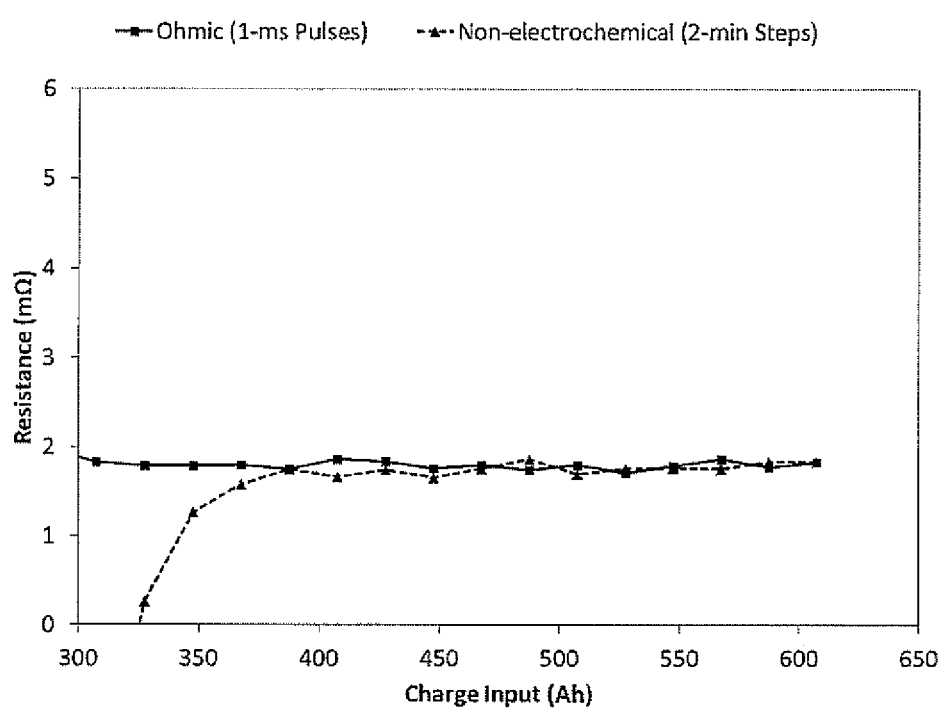

FIGS. 7, 8, and 9 show graphs illustrating Example 4 (Tafel staircase).

Figure 10:
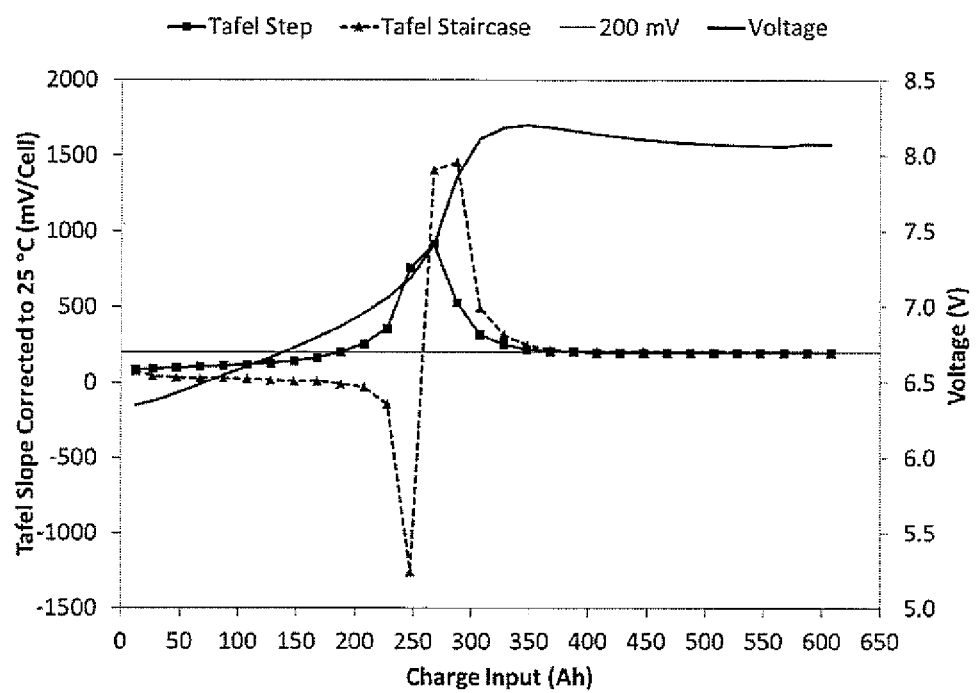
Figure 11:
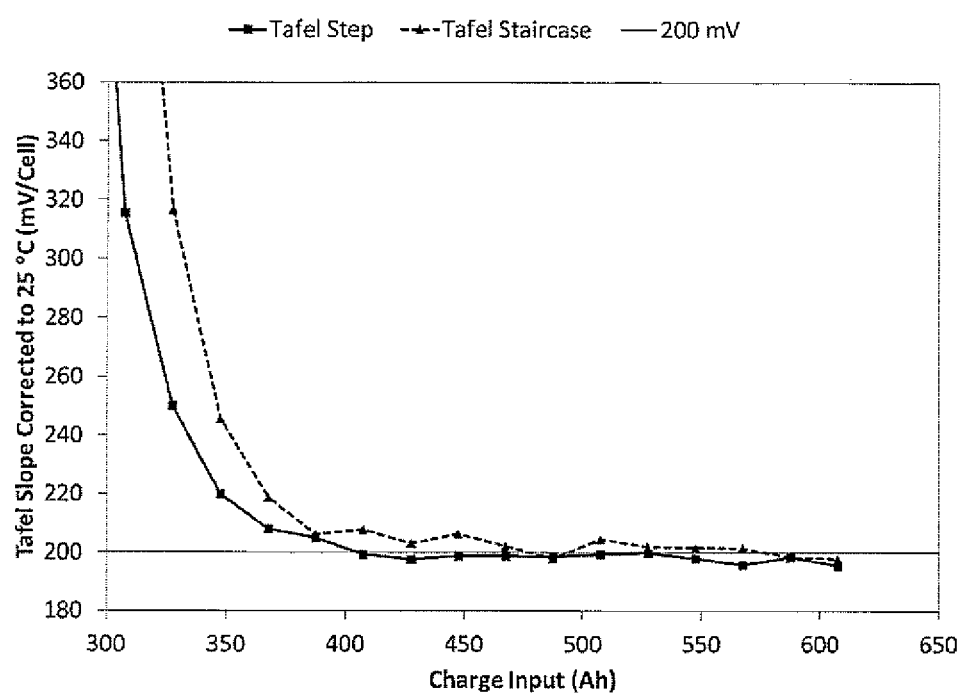

FIGS. 10 and 11 show graphs comparing Tafel step and Tafel staircase methods in Example 4.

Figure 12:
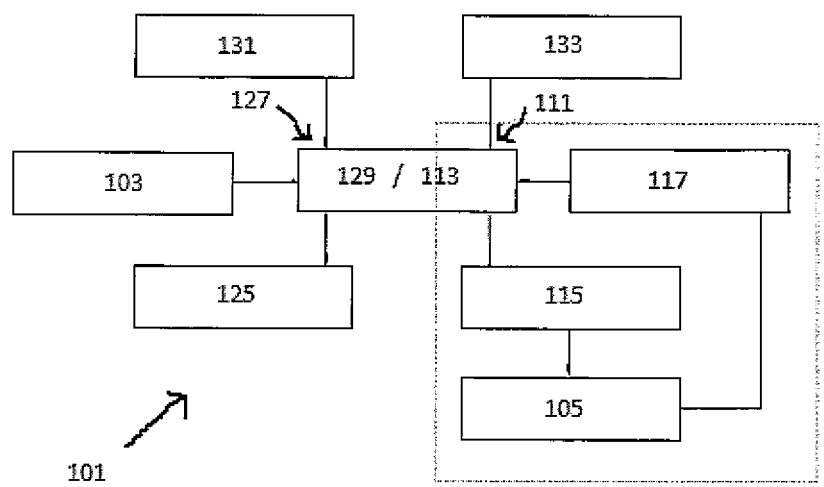

FIG. 12 shows a diagram of a state-of-charge system (dashed area of 12 depicted as a zoomed-in view at 13).

Figure 13:
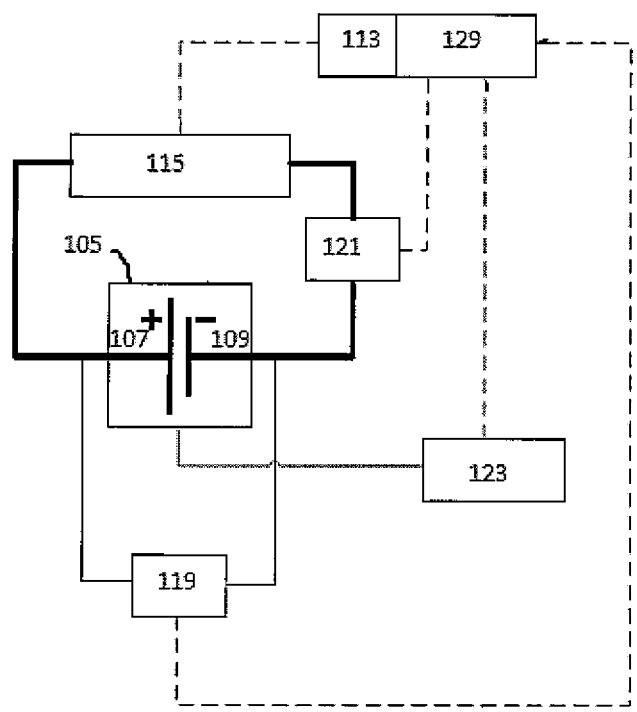

FIG. 13 shows a zoomed-in view of part of a state-of-charge system.

Figure 14:
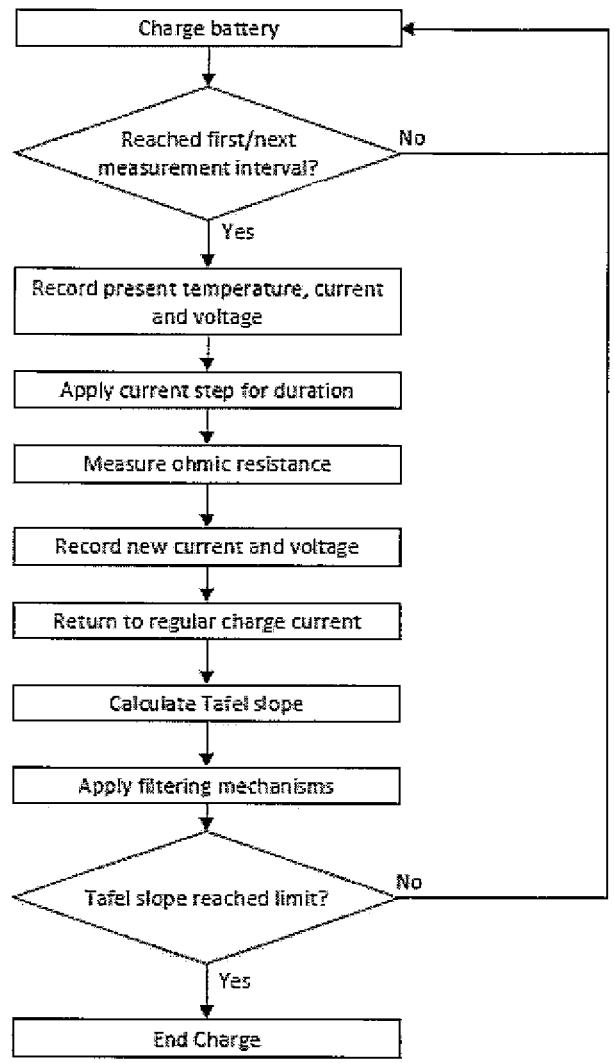

FIG. 14 shows a generalized flow diagram for one embodiment of a Tafel step method.

Figure 15:
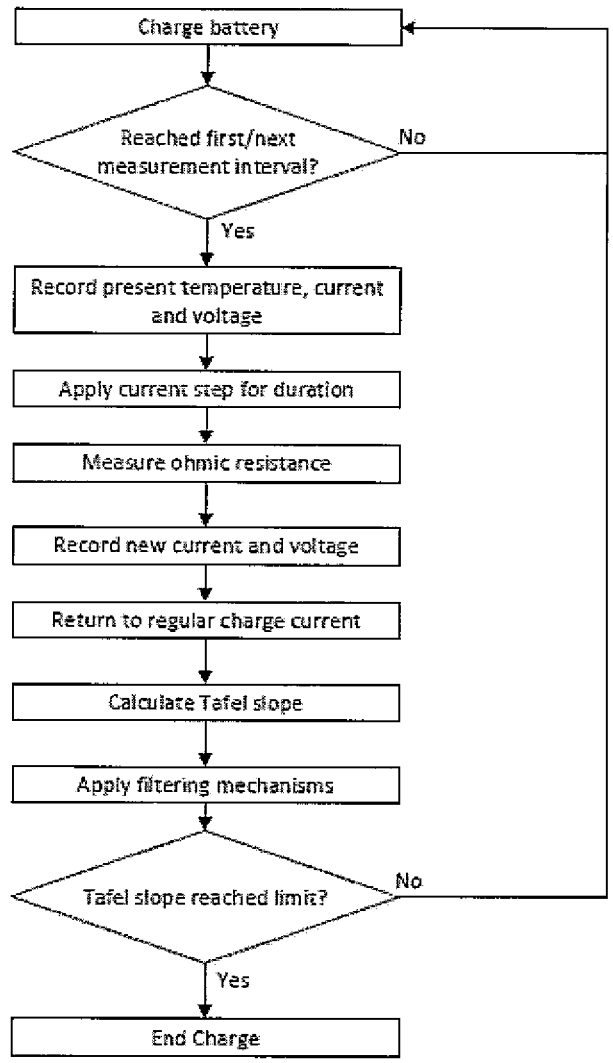

FIG. 15 shows a generalized flow diagram for one embodiment of a Tafel staircase method.

PARTS LEGEND

- 101 State-of-charge system
- 103 Power source
- 105 Battery
- 107 Positive terminal of the battery
- 109 Negative terminal of the battery
- 111 Control module
- 113 Control module microprocessor
- 115 Output electrical component
- 117 Sensors
- 119 Voltage sensor
- 121 Current sensor
- 123 Temperature sensor
- 125 State-of-charge indicator
- 127 Analysis module
- 129 Analysis module microprocessor
- 131 Analysis code
- 133 Instruction code
- 303 Charge/discharge battery test system
- 305 Battery
- 319 Connections for voltage sensing
- 321 Connections for applying current
- 323 Connection for temperature sensing New methods and systems have been developed which allow for experimental determination of Tafel slope in a battery, using it to evaluate the state-of-charge of a battery during charge, during discharge, during formation/manufacturing, and in other contexts by reference to a predetermined Tafel slope target value that is characteristic of a given battery at that state-of-charge. A target value of Tafel slope can be predetermined based on a battery type such that the target value can be considered characteristic of a battery of that battery type at certain states-of-charge, such as when the battery is transitioning from a main electrochemical reaction to a side electrochemical reaction, or from one main electrochemical reaction to another main electrochemical reaction.

Figure 1:
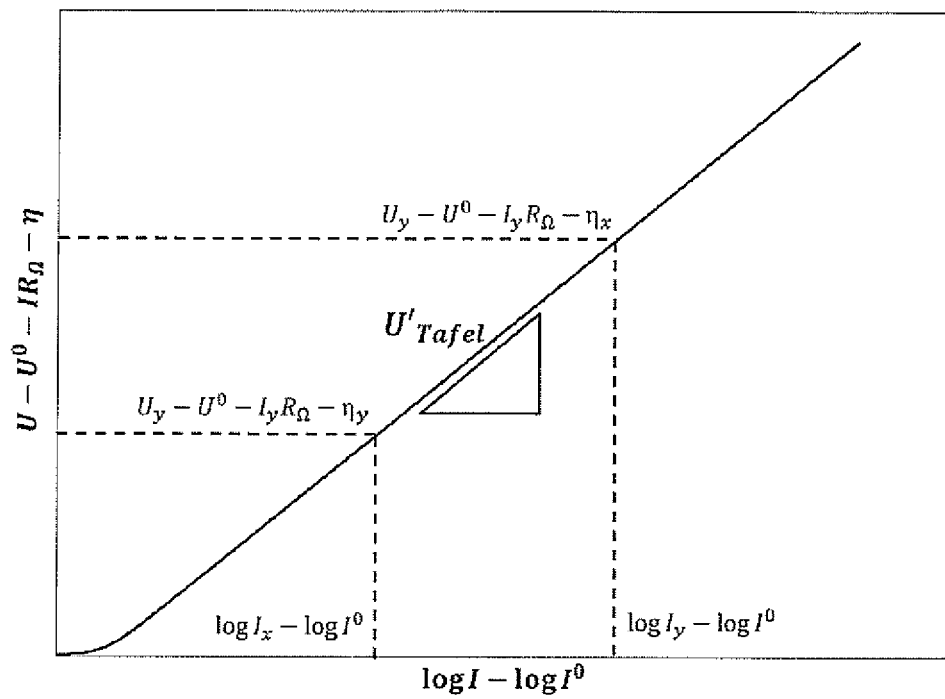
FIG. 1 shows a graph of a Tafel slope given by comparison of two overvoltage-current operating points.

FIG. 1 illustrates a Tafel slope and the logarithmic relationship between overpotential and current. A novel definition for the Tafel slope is derived by comparing two different operating points (x and y) on the linear curve. This is carried out in Eq. (6), where it is reasonably assumed that $U^0$ and $I_0 I^0$ are conserved at both operating points, resulting in the cancellation of these two terms. Since $R_n$ is a ratio of the ohmic voltage drop to the flowing current, this parameter can also be assumed to be conserved at both operating points.

$$U'_{Tafel} = \frac{[U_y - U^0 - I_y R_\Omega - \eta_y] - [U_x - U^0 - I_x R_\Omega - \eta_x]}{[\log I_y - \log I^0] - [\log I_x - \log I^0]} \quad (6)$$

$$U'_{Tafel} = \frac{U_y - U_x - (I_y R_\Omega - I_x R_\Omega) - (\eta_y - \eta_x)}{\log I_y - \log I_x} \quad (7)$$

$$U'_{Tafel} = \frac{U_y - U_x - (I_y - I_x) R_\Omega - \eta_{xy}}{\log\left(\frac{I_y}{I_x}\right)} \quad (8)$$

In Eq. (8) the $(\eta_y - \eta_x)$ term has been simplified to $\eta_{xy}$, which represents the change in non-electrochemical overpotential between the $(I_x, U_x)$ and $(I_y, U_y)$ operating points.

Utilizing this novel definition for the Tafel slope, in an embodiment, a method of measuring Tafel slope comprises stepping from an initial current value to one or more new current values on a time scale allowing for voltage to substantially stabilize at each current value. The reaction layer at each battery electrode can display substantial capacitance and therefore it is desirable to wait for voltage to substantially stabilize at each current value. The amount of time required to so stabilize depends on the capacitance of the battery electrode reaction layer, among other factors, for each battery type. In some embodiments, this amount of time is no more than about five minutes. In some embodiments, this amount of time is no more than about one minute. In some embodiments, this amount of time is no more than about 30 seconds. In some embodiments, this amount of time is no more than about 20 seconds. In some embodiments, this amount of time is no more than about 10 seconds. In some embodiments, this amount of time is no more than about 5 seconds. In some embodiments, this amount of time is no more than about 3 seconds. In some embodiments, this amount of time is no more than 1 second. In some embodiments, a value for the electrical potential at a given new current value is assigned upon a single measurement taking place on an applicable time period as given above. In some embodiments, the amount of time can be adaptively identified using a measure of voltage stabilization (e.g., iterative measurements until dU/dt is approximately equal to zero or less than an appropriate cutoff that signifies substantial stabilization, at which time a value for the electrical potential is assigned upon the last measurement). However, taking a voltage measurement for a new current value substantially beyond the time scales discussed above may give rise to mass-transport effects or changes in state-of-charge (which influence $U^0$ and $I^0$), and thereby detrimentally influence Tafel slope measurement.

Figure 2:
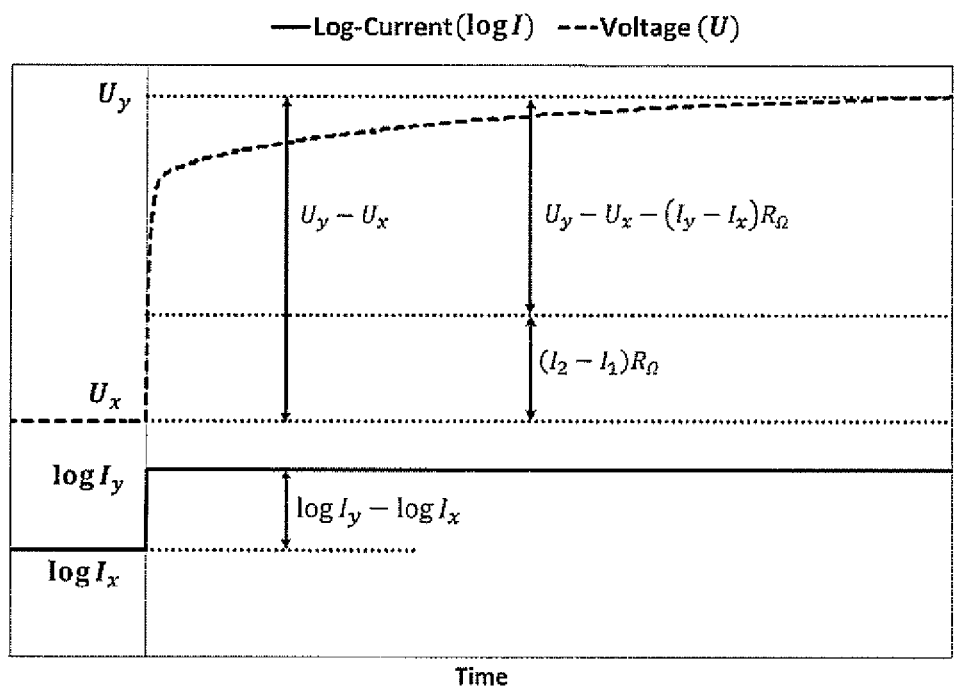
FIG. 2 shows a graph illustrating Example 1 (current step and corresponding voltage response).

An experimental example for the above method, also referred to herein as "Tafel step", is illustrated in FIG. 2. When the battery current is stepped from $I_x$ to $I_y$, voltage will change from $U_x$ to eventually approach a new equilibrium, substantially stabilizing at $U_y$ as the electrochemical reaction rate changes according to the new current flow. In some embodiments, $R_\Omega$ is calculated by dividing the measured ohmic voltage change within milliseconds of the step by the change in current. In some embodiments, quantities needed to calculate $R_\Omega$ are measured during, shortly before, or shortly after the current step, using AC injection or rapid DC pulse trains. In some embodiments, quantities needed to calculate $R_\Omega$ are measured two or more times for each step and an average $R_\Omega$ is determined. While there are effective methods available for determining $R_\Omega$ in-situ, the same is not so for $\eta_{xy}$. As long as the contribution from $\eta_{xy}$ is negligible however, assigned values for $I_x$, $U_x$, $I_y$, $U_y$, and $R_\Omega$ for a given current step are sufficient for experimental determination of the Tafel slope using Eq. (8).

In some embodiments, an ohmic resistance method measures ohmic resistance of a battery cell using AC current injection. In some embodiments, an ohmic resistance method measures ohmic resistance using DC current pulse. In some embodiments, an ohmic resistance method measures ohmic resistance of a battery cell using DC pulse-to-rest, in which a DC current pulse is halted temporarily such that the current is zero during the pulse. In some embodiments, an ohmic resistance method measures ohmic resistance of a battery cell using DC pulse-up, in which a DC current pulse is applied to a reference DC current such that the current is temporarily higher. In some embodiments, an ohmic resistance method measures ohmic resistance of a battery cell using DC pulse-down, in which a DC current pulse is applied to a reference DC current such that the current is temporarily lower. In some embodiments, an ohmic resistance method combines two or more current pulses taken in succession (e.g., by averaging) in order to reduce noise in measurement. In some embodiments, an ohmic resistance method measures ohmic resistance of a battery cell using a plurality of the foregoing measurements. In some embodiments, AC injection is used at a frequency equal to about 10 kHz. In some embodiments, AC injection is used at a frequency between about 1 kHz to about 10 kHz. In some embodiments, AC injection is used at a frequency equal to about 1 kHz. In some embodiments, AC injection is used at a frequency between about 100 Hz to about 1 kHz. In some embodiments, AC injection is used at a frequency equal to about 100 Hz. In some embodiments, AC injection is used at a frequency between about 10 Hz to about 100 Hz. In some embodiments, AC injection is used at a frequency equal to about 10 Hz. In some embodiments, AC injection is used at a frequency between about 1 Hz to about 10 Hz. In some embodiments, AC injection is used at a frequency equal to about 1 Hz. In some embodiments, the AC current injection has a current amplitude between about 1 microampere to about 10 ampere. In some embodiments, the current amplitude is about 100 milliampere. In some embodiments, DC pulse trains of about 1 ms are used in which two or more DC current pulses of duration 1 ms are performed successively and averaged.

In some embodiments, ohmic resistance is determined by reference to a previously obtained value for ohmic resistance characteristic of that battery type. In some embodiments, ohmic resistance is determined by measuring applicable quantities of an equation for $R_\Omega$ and calculating $R_\Omega$. In some embodiments, ohmic resistance is determined by measuring applicable quantities of an equation for $R_{xyz}$ and calculating $R_{xyz}$.

"About" in the context of time is broadly intended herein to mean a duration that has similar magnitude and performance when compared to the named time; "about 2 milliseconds" would include at least values between 1 millisecond and 3 milliseconds, but not, for example, 1 second.

In some embodiments, a method of determining state-of-charge in a battery that exhibits during charging or discharging reactions comprising at least one electrochemical main reaction system and at least one electrochemical side reaction system is disclosed, the method comprising periodically stepping the current so as to measure Tafel slope of the battery and determining that the battery is approximately fully charged when calculated Tafel slope is approximately equal to a predetermined Tafel slope for a predetermined electrochemical side reaction system. In some embodiments, the charging reactions of a battery involve exactly one electrochemical main reaction system (conversion of electrode material) and exactly one predominant electrochemical side reaction system (wasted electricity) and the battery can be considered to be completely charged once nearly all of the charging current is flowing through the side reaction (in other words, there is no more convertible electrode material); thus when the battery is approximately fully charged, the calculated Tafel slope matches the value of Tafel slope that applies to the side reaction, and when the battery is not fully charged, the calculated Tafel slope should differ from that value. The difference between the calculated Tafel slope and the Tafel slope of the side reaction can thereby be used as in indicator of the state-of-charge of the battery. In some embodiments, a battery exhibits multiple series or parallel electrochemical reaction mechanisms during charging or discharging. "Exhibits . . . during charging or discharging" is used herein to describe the variety of electrochemical reaction mechanisms that take place during the charging or discharging process at various times, but does not imply that in order to use the methods herein on that battery, all such mechanisms must be occurring at the state-of-charge of a given battery, nor that a given battery must be continuously charging or discharging.

In the definition of Tafel slope given in Eq. (2), the only parameter that should vary for a given reaction is the temperature (T). In order to account for this variation, the Tafel slope formula in Eq. (8) can be adjusted to correct for temperature. This is shown in Eq. (9)(9), where the temperatures are in Kelvin. Note that while $R_\Omega$ will also feature some temperature dependence, this effect will be relatively insignificant in comparison to the linear temperature dependence of the Tafel slope.

$$U'_{Tafel} @ T_{ref} = U'_{Tafel} @ T\left(\frac{T_{ref}}{T}\right) \tag{9}$$

Thus in practice, the temperature (in Kelvins) can be measured simultaneously with the current step sequence measurements in order to provide a corrected comparison with the predetermined target value of Tafel slope, which is typically given in literature at a reference temperature (e.g. 25° C.). The difference between the calculated Tafel slope and the predetermined target value of Tafel slope can then be used to estimate the state-of-charge, where a full charge is indicated when this difference is within a predetermined tolerance of zero. In some embodiments, the temperature is measured in an electrolyte solution within a battery. In some embodiments, the temperature is measured at the side of a battery. In some embodiments, the temperature is measured at the top a battery. In some embodiments, the temperature is measured in a temperature well within a battery.

Figure 6:
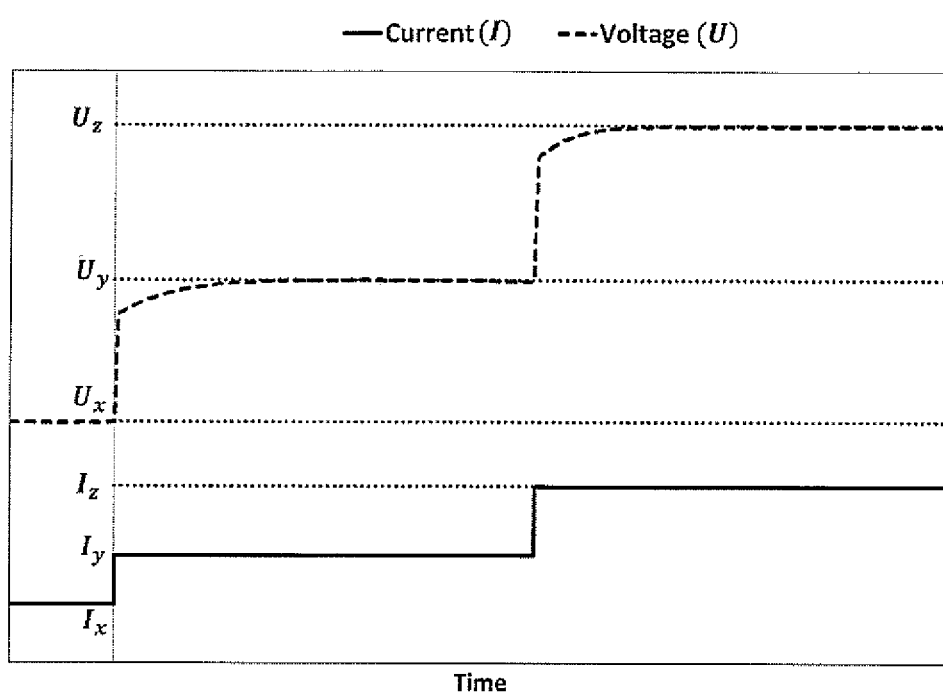
FIG. 6 shows a graph illustrating a Tafel staircase.

Rather than assuming $\eta_{xy}$ to be negligible, a method herein referred to as "Tafel staircase" can be employed. This method ensures that non-electrochemical overpotentials are accounted for. Additionally, this method can avoid the use of rapid-transient methods such as AC current injection or high frequency pulsing for the measurement of $R_\Omega$. The method comprises measuring the stabilized voltage $U_x$ at a first current step $I_x$, and performing two or more current steps $I_y$, $I_z$, stopping at each step long enough to establish their respective substantially stabilized voltages $U_y$, $U_z$. See FIG. 6 for an illustration.

The Tafel staircase method requires three assumptions, the first of which is that the Tafel slope of the first current step is equal to that of the second current step. This assumption is valid for a single electrochemical reaction mechanism as long as there is a negligible change in state-of-charge during the current step sequence. Using this assumption, measurement of $I_x$, $I_y$, $I_z$, $U_x$, $U_y$, and $U_z$ allows for isolation of $\eta_{xy}$ and $\eta_{yz}$ by equating the Tafel slope formulae in Eq. (8) for the xy and yz steps. This is carried out in Eq. (10) and Eq. (11).

$$\frac{(U_y - U_x) - (I_y - I_x)R_\Omega - \eta_{xy}}{\log\left(\frac{I_y}{I_x}\right)} = \frac{(U_z - U_y) - (I_z - I_y)R_\Omega - \eta_{yz}}{\log\left(\frac{I_z}{I_y}\right)} \quad (10)$$

$$[(I_y - I_x)R_\Omega + \eta_{xy}]\log\left(\frac{I_z}{I_y}\right) - [(I_z - I_y)R_\Omega + \eta_{yz}]\log\left(\frac{I_y}{I_x}\right) = \quad (11)$$

$$(U_y - U_x)\log\left(\frac{I_z}{I_y}\right) - (U_z - U_y)\log\left(\frac{I_y}{I_x}\right)$$

In order to solve for the non-electrochemical overpotentials, the second assumption for the Tafel staircase method must be made. It will be assumed that $\eta_{xy}$ is a function directly proportional to the current step magnitude, along with a multiplier ($c_{xy}$), as shown in Eq. (12).

$$\eta_{xy} = f(I_x, I_y) = c_{xy}(I_y - I_x) \quad (12)$$

Overpotentials from concentration gradients and crystallization are unlikely to follow a strictly linear dependence on the current step magnitude, but this is a necessary simplification. This enables for a merging of the effects of $R_\Omega$ and $\eta_{xy}$ into a more general "non-electrochemical resistance" or $R_{xy}$ using Eq. (13).

$$R_{xy} = R_\Omega + c_{xy} \quad (13)$$

The formulation in Eq. (11) can now be updated into the form shown in Eq. (14).

$$(I_y - I_x)R_{xy}\log\left(\frac{I_z}{I_y}\right) - (I_z - I_y)R_{yz}\log\left(\frac{I_y}{I_x}\right) = \quad (14)$$

$$(U_y - U_x)\log\left(\frac{I_z}{I_y}\right) - (U_z - U_y)\log\left(\frac{I_y}{I_x}\right)$$

No number of current steps will allow for a system of equations which can solve for all values of $R_{xy}$. Therefore, one more simplification is required. The third assumption is that for subsequent current steps, $R_{xy}$ is conserved for each step. This is shown in Eq. (15).

$$R_{xy} = R_{yz} = R_{xyz} \quad (15)$$

This can be assumed because the ohmic component of $R_{xyz}$ is independent of the current magnitude, and thus will remain constant if different current steps are carried out in succession. The ohmic resistance does depend on the state-of-charge of the battery, but this effect should be negligible over the course of several short subsequent current steps which account for a relatively small amount of charge. Overpotentials from concentration gradients and crystallization likely carry some dependence on the current magnitude, but it is assumed that any such deviation will be negligible. This assumption now allows for solving of $R_{xyz}$ using only $I_x$, $I_y$, $I_z$, $U_x$, $U_y$, and $U_z$, as shown in Eq. (16).

$$R_{xyz} = \frac{(U_y - U_x)\log\left(\frac{I_z}{I_y}\right) - (U_z - U_y)\log\left(\frac{I_y}{I_x}\right)}{(I_y - I_x)\log\left(\frac{I_z}{I_y}\right) - (I_z - I_y)\log\left(\frac{I_y}{I_x}\right)} \quad (16)$$

Using this value of $R_{xyz}$, the Tafel slope can be calculated for either of the current steps used in determining $R_{xyz}$, as shown in Eq. (17).

$$U'_{Tafel} = \frac{(U_y - U_x) - (I_y - I_x)R_{xyz}}{\log\left(\frac{I_y}{I_x}\right)} = \frac{(U_z - U_y) - (I_z - I_y)R_{xyz}}{\log\left(\frac{I_z}{I_y}\right)} \quad (17)$$

It should be noted that at least three unique (I, U) operating points are required to determine $R_{xyz}$. For example, if the current is stepped from $I_x$ to $I_y$ and then back to $I_x$, the denominator in Eq. (16) will go to zero, which produces infinity. Note that since the first assumption of the Tafel staircase method requires that there be a single electrochemical reaction mechanism, the Tafel staircase method will only approximate the Tafel step method when there is a single electrochemical reaction mechanism taking place at the time of measurement.

To improve precision in the calculated $R_{xyz}$, in some embodiments a third Tafel step is implemented (e.g. $I_z$ to $I_w$). This allows for an additional calculation yielding $R_{wyz}$ (as well as $R_{wxy}$, and $R_{wxz}$, and $R_{wxyz}$). If the values are in agreement with each other, then all assumptions made are valid and the calculated value of $R_{xyz}$ is accurate. In some embodiments, this procedure can be extended to a fourth Tafel step, optionally a fifth Tafel step, optionally more than five Tafel steps.

The aforementioned Tafel step and Tafel staircase methods can be practiced with a device, which in some embodiments is portable. In some embodiments, the device is used by technicians in the service industry. In some embodiments, the device is used by owners of lead-acid battery systems, even without technical training. In some embodiments, a method or device comprises aspects as described in International Patent Publication Ser. No. WO/2017/024411, hereby incorporated by reference. In some embodiments, state-of-charge systems utilize one or more measurements of ohmic resistance according to the methods described herein and two or more measurements of voltage and current according to the methods described herein in order to calculate Tafel slope, with such methods performed according to the timescales of measurement that are respectively applicable to each measurement as described herein.

FIGS. 12 and 13 provide a functional diagram of a state-of-charge system illustrative of apparatus embodying the methods described herein. A state-of-charge system 101 has a power source 103 that provides a source of electricity for applying a current, as well as to power components of the system. The power source is connected to the analysis module 127 and to the control module 111, each of which is controlled by their respective microprocessors 129 and 113. In some embodiments and as depicted in FIG. 12, these modules are encoded onto the same electronic component such that the microprocessor 129 and the microprocessor 113 are the same device running different instructions as required for operation. The analysis module 127 is programmed by microprocessor-readable analysis code 131, supplied by software, firmware, or by other methods known in the art. The control module 111 is programmed by microprocessor-readable instruction code 133, supplied by software, firmware, or by other methods known in the art. The control module 111 is electrically connected to the output electrical component 115 such that it is interposed between the power source 103 and the output electrical component 115 and can control current flowing to a battery 105. These may in some embodiments be enclosed in an enclosure (not shown) that has a plurality of ports allowing for connection of sensors, mains power, and interconnects between the output electrical component 115, the positive terminal 107 and negative terminal 109 of the battery 105. In some embodiments, there is a plurality of output electrical component "channels" and ports for sensors 117 that are separately controllable by the control module 111 and analyzable by the analysis module 127 for charging or discharging of a plurality of batteries 105; or in some embodiments, controlled by a plurality of control modules corresponding to each channel. These channels provide for individual addressing of the state-of-charge for a given battery. In some embodiments, there is only one channel for use with a single battery.

Sensors 117 are connected to each battery such that at least current and voltage can be determined. In some embodiments, ohmic resistance is determined by use of a voltage sensor 119 and a current sensor 121, applying an ohmic resistance equation such as one of those discussed above. In some embodiments, Tafel slope is determined by use of a voltage sensor 119 and a current sensor 121, applying a Tafel slope equation such as one of those discussed above. In some embodiments, the sensors 117 also have a temperature sensor 123. In some embodiments the temperature sensor 123 is connected to the external wall or placed within a temperature well or into electrolyte within the battery. In some embodiments the temperature sensor 123 feeds its output to the analysis module 127 by means of a port on the enclosure. In some embodiments the voltage sensor 119 feeds its output to the analysis module 127 by means of a port on the enclosure. In some embodiments the current sensor 121 feeds its output to the analysis module 127 by means of a port on the enclosure.

Each battery 105 has a positive terminal 107 and a negative terminal 109, and the system 101 supplies current to each battery by attaching the output electrical component 115 that corresponds to that battery to its battery terminals 107 and 109. Control of the current is accomplished by the control module 111 via its microprocessor 113 and associated electronics. The sensors 117 connect to each circuit formed between the output electrical component 115 and each battery 105 (via its terminals). In some embodiments, a current sensor 121 is connected to each circuit between the component 115 and the negative terminal 109, or alternatively between the component 115 and the positive terminal 107; the sensor 121 then sends current information to the analysis module 127 via its microprocessor 129 and associated electronics. In some embodiments, a temperature sensor 123 is connected to each battery 105 at a position considered indicative of the battery's temperature; the sensor 123 then sends temperature information to the analysis module 127 via its microprocessor 129 and associated electronics. In some embodiments, a voltage sensor 119 is connected between the positive terminal 107 and the negative terminal 109; the sensor 119 then sends voltage information to the analysis module 127 via its microprocessor 129 and associated electronics. In some embodiments, ohmic resistance is calculated within the analysis module 127 using an ohmic resistance equation and the current and voltage information provided to the module.

In some embodiments, the instruction code has a Tafel slope measurement method. In some embodiments, the instruction code has one or more Tafel slope measurement methods and one or more ohmic resistance measurement methods. In some embodiments, the control module has instruction code to perform one or more Tafel slope measurement methods and one or more ohmic resistance measurement methods during a measurement interval for each battery, for analysis by the analysis module. A measurement interval can include the results of one or more measurement methods, which may be the same method or different methods. In some embodiments, the analysis module uses the results of the measurement method as its own measurement interval. In some embodiments, the analysis module has analysis code to combine (for example, by averaging) the results of corresponding measurement methods within the measurement interval.

In some embodiments, Tafel slope measurement methods comprise measuring voltage at a DC current step, in which there is a step change in current. DC current step can be performed with reference to a reference current, such that the DC current applied during stepping can be expressed as a percentage higher or lower than the reference current. In some embodiments, the step change in current is an immediate change from the reference current to the stepped current. In some embodiments, the step change in current is accomplished gradually by ramping current from the reference current to the stepped current. In some embodiments, the ramping from the reference current to the stepped current occurs within about 5 minutes. In some embodiments, the DC current step can be less than about 300% higher, or less than about 200% higher, or less than about 100% higher, or less than about 75% higher, or less than about 50% higher, or less than about 25% higher, or less than about 10% higher than the reference current. In some embodiments, the DC current step can be less than about 100% lower, or less than about 50% lower, or less than about 25% lower, or less than about 10% lower than the reference current. In some embodiments, the DC current step is held for about five minutes prior to measuring voltage. In some embodiments, the DC current step is held for between about four minutes and about five minutes. In some embodiments, the DC current step is held for about four minutes. In some embodiments, the DC current step is held for between about three minutes and about four minutes. In some embodiments, the DC current step is held for about three minutes. In some embodiments, the DC current step is held for between about two minutes and about three minutes. In some embodiments, the DC current step is held for about two minutes. In some embodiments, the DC current step is held for between about one minute and about two minutes. In some embodiments, the DC current step is held for about one minute. In some embodiments, the DC current step is held for between about 30 seconds and about one minute. In some embodiments, the DC current step is held for about 30 seconds. In some embodiments, the DC current step is held for at least about 10 seconds but no more than about 30 seconds. In some embodiments, the DC current step is held for at least 1 second but no more than about 10 seconds. In some embodiments, the amount of time for the DC current step to be held can be predetermined for a given battery type using a measure of voltage stabilization (e.g., when dU/dt is approximately equal to zero or less than an appropriate cutoff that signifies substantial stabilization).

In some embodiments, ohmic resistance measurement methods comprise DC current pulse, in which there is a transient change in current (note that this "DC current pulse" is much shorter in duration than the "DC current step" used for Tafel slope measurement). DC current pulse can be performed with reference to a reference current, such that the DC current applied during pulsing can be expressed as a percentage higher or lower than the reference current. In some embodiments, the DC current pulse can be less than about 300% higher, or less than about 200% higher, or less than about 100% higher, or less than about 75% higher, or less than about 50% higher, or less than about 25% higher, or less than about 10% higher than the reference current. In some embodiments, the DC current pulse can be less than about 100% lower, or less than about 50% lower, or less than about 25% lower, or less than about 10% lower than the reference current. In some embodiments, the DC current pulse is to zero current. In some embodiments, the DC current pulse has a preselected time-based duration prior to measuring voltage. In some embodiments, the duration is within about 10 milliseconds. In some embodiments, the duration is about 1 millisecond. In some embodiments, the duration is within about 1 millisecond.

A sequence includes one or more measurement intervals. In some embodiments, the control module has instruction code to perform a plurality of measurement intervals in the sequence, which may be, but need not be identical to a previous performed sequence. In some embodiments, the sequence repeats on a regular or periodic basis, such as about every 10 minutes, about every 30 minutes, about every hour, or about every five hours. In some embodiments the sequence is performed according to a predetermined schedule. One example of a predetermined schedule for a charging application is to perform the sequence every sixty minutes after beginning charging, then to perform the sequence every ten minutes during mid-charge, and then to perform the sequence every five minutes until the state-of-charge criterion is met. Predetermined schedules can be encoded within the control module on the basis of a given application or use case for the state-of-charge system and selected based on that application or use case. In some embodiments, the sequence has one or more measurement intervals, each of which has periodic measurements on one timescale and frequency of ohmic resistance (e.g., comprising DC current pulse) and periodic measurements on another timescale and frequency of Tafel step or staircase (e.g., comprising DC current step), each such timescale and frequency being preselected to produce reliable measurement of the relevant property.

In some embodiments, the analysis module has analysis code to compute the moving average of adjacent measurement intervals within the sequence. Such filtering mechanisms may be useful to avoid artifactually meeting a state-of-charge criterion due to noise in an individual measurement. In some embodiments, the filtering mechanism is averaging. In some embodiments, the filtering mechanism is weighted averaging. In some embodiments, the filtering mechanism is moving or windowed averaging, or alternatively, some other statistical filtering method.

In some embodiments, the analysis module has analysis code to compute Tafel slope using applicable equations and filtering mechanisms herein and to compare to a state-of-charge criterion. In some embodiments, the state-of-charge criterion is met when the Tafel slope has at any time reached a predetermined target value that is characteristic of the battery for the desired state-of-charge. In some embodiments, the state-of-charge criterion is met when the Tafel slope has within a measurement interval reached a predetermined target value that is characteristic of the battery for the desired state-of-charge. In some embodiments, the state-of-charge criterion is met when the Tafel slope has within a sequence reached a predetermined target value that is characteristic of the battery for the desired state-of-charge. In some embodiments, the state-of-charge criterion is met when the Tafel slope has within two or three or four or five or more measurement intervals reached a predetermined target value that is characteristic of the battery for the desired state-of-charge. In some embodiments, whether the predetermined target value has been reached depends on whether the calculated Tafel slope is within a plus-or-minus tolerance range about the predetermined target value. In some embodiments, the plus-or-minus tolerance range is within about 5% or about 4% or about 3% or about 2% or about 1.5% or about 1% or about 0.5%. In some embodiments, the plus-or-minus tolerance range, on a per electrochemical cell basis, is within about 10 mV or about 5 mV or about 2 mV. Selection of a plus-or-minus tolerance range may depend on a number of factors in the art including the desired state-of-charge, desired degree of formation, desired use case/charge regime, and other factors in the art based on characteristics of a given battery size, type, or design. In some embodiments, meeting the state-of-charge criterion according to a predetermined plus-or-minus tolerance range results in commanding a new sequence comprising new current step, rest period, or partial discharge and establishing a new state-of-charge criterion or plus-or-minus tolerance range desired for this new sequence.

In some embodiments, the analysis module 127 signals the control module 111 to stop supplying current to the battery 105 once it has reached a state-of-charge criterion. In a preferred embodiment, the state-of-charge criterion is met when the Tafel slope is approximately equal to the predetermined Tafel slope target value that is characteristic of a given battery and state-of-charge. Establishing the Tafel slope target value for a given battery and state-of-charge can be performed, for example, by measuring Tafel slope throughout battery formation, charge, or discharge for one or more batteries within a given battery type or design and assigning a predetermined Tafel slope target value that is characteristic for an applicable battery for each state-of-charge and use case/charge regime. In some embodiments, the analysis module 127 has reference to a lookup table of Tafel slope target values associated with the battery type, design, state-of-charge, use case, or charge regime being utilized with the system. In some embodiments, once the state-of-charge criterion is met, a state-of-charge-indicator 125 is activated. In some embodiments, the indicator 125 has at least a visual aspect. In some embodiments, the indicator 125 displays text indicating charging is complete. In some embodiments, the indicator 125 has at least an aural aspect, such as an alarm. In some embodiments, there are a plurality of state-of-charge-indicators that correspond to the channel that has completed charging.

In some embodiments, a battery charger has an indicator of state-of-charge utilizing one or more of the aforementioned methods. In some embodiments, a battery diagnostics tool utilizing one or more of the aforementioned methods is used for analyzing the state-of-charge of a given battery. In some embodiments, a battery diagnostics tool utilizes the Tafel staircase method to determine ohmic resistance $R_{xy}$ during charge. In some embodiments, a battery diagnostics tool utilizes the Tafel staircase method to determine ohmic resistance $R_{xyz}$ during discharge. While knowing the ohmic resistance of a discharging battery is not sufficient information to accurately determine state-of-charge, it is nevertheless useful as an indicator of state-of-health (aging effects) in a battery.

In some embodiments, machine readable code is provided, capable of being run on a programmable machine (e.g., a computer), where the machine is equipped with input from temperature, current, and voltage measurement equipment and output to charge controllers for a battery. In some embodiments, the steps illustrated by FIG. 14 are encoded.

In some embodiments, the steps illustrated by FIG. 15 are encoded. In some embodiments, steps analogous to those illustrated by FIG. 14 or FIG. 15 are encoded for discharging a battery and halting discharge when the Tafel slope reaches a limit that has been preset as a state-of-charge criterion. In some embodiments, machine readable code is read by a programmable machine having a processor by communicative coupling to a non-transitory computer readable medium. When executed by the processor, the machine readable code executes a computer program, causing the processor (and consequently, the programmable machine and associated input devices) to perform any one or more of the embodiments of methods described herein. In some embodiments, the programmable machine may be a computer. In some embodiments, the programmable machine may comprise one or more programmable logic controllers, real-time embedded controllers, digital signal processors, field programmable gate arrays, or application-specific integrated circuits. In some embodiments, the programmable machine responds to user input, such as a keyboard, mouse, touchscreen, array of control switches or buttons, or some other user input device. Examples of non-transitory computer readable media comprise disc-based media such as CD-ROMs and DVDs, magnetic media such as hard drives and other forms of magnetic disk storage, and semiconductor based media such as flash media, random access memory, and read only memory. In some embodiments, a machine or code comprises aspects as described in International Patent Publication Ser. No. WO/2017/024411.

Utility is further demonstrated by reference to the Examples below. Other design variations are possible.

EXAMPLES

Example 1

Measurement of a Tafel Slope Using a Tafel Step

An experimental example of a Tafel step is illustrated in FIG. 2. If the battery current is stepped from $I_1$ to $I_2$, $R_\Omega$ can be measured by capturing the voltage change shortly (for example, milliseconds) after the current is stepped. The voltage will then continue to change over time (for example, tens of seconds) as the electrochemical reaction rate changes according to the new current flow. Alternatively, $R_\Omega$ can be measured independently from the Tafel step using AC injection or rapid DC pulse trains; when so measured, $R_\Omega$ can be determined at any time during the Tafel step process. By measuring $I_1$, $U_1$, $I_2$, $U_2$, and $R_\Omega$ for a given current step, an experimental determination of Tafel slope can be achieved.

Example 2

Measurement of State-of-Charge During Battery Formation

In the case of lead-acid batteries, the dominant electrochemical side reaction is the electrolysis of water in the aqueous electrolyte. The Tafel slope of this reaction system is known to be nominally 200 mV at a reference temperature of 25° C. for a typical lead-acid system, comprising an 80 mV component for hydrogen gas evolution at the negative electrode and a 120 mV component for oxygen gas evolution at the positive electrode. Thus, by comparing the calculated Tafel slope of the battery to the theoretical predetermined value in the side reaction, a novel indicator of state-of-charge is established.

Figure 3:
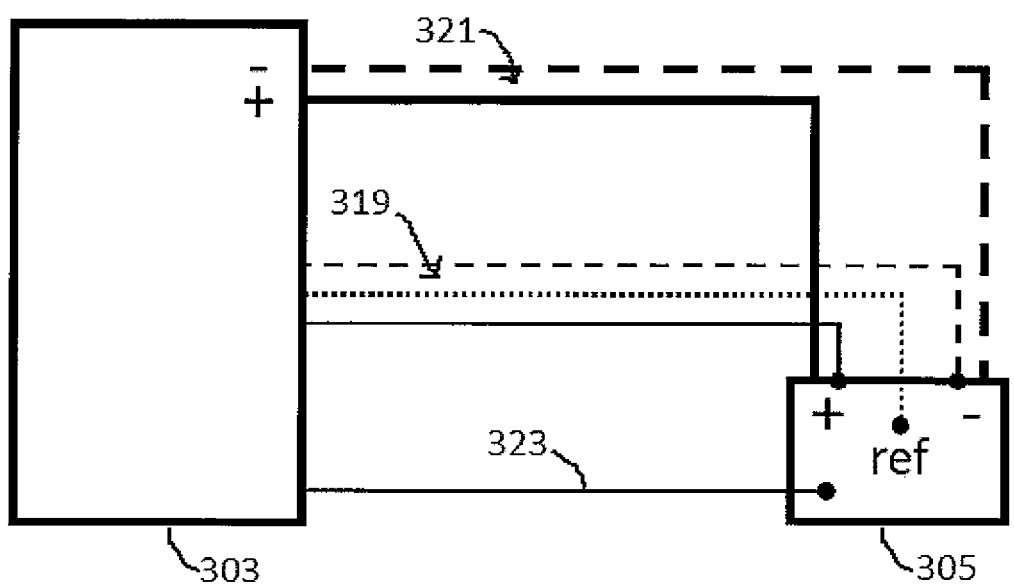
FIG. 3 shows aspects of an apparatus used in Example 2.

One experimental verification involved conducting a constant-current formation of a 375 amp-hour flooded lead-acid cell (2 volt) in the laboratory. Tafel steps of 30 seconds each were carried out at roughly 30 minute intervals using a charge/discharge battery test system 303, applying a regular charging current of 40 A for $I_x$ and a stepped current of 70 A for $I_y$ via connections 321. These applied currents were used to measure $U_x$, and $U_y$, via connections 319, while $R_\Omega$ was measured at the end of each 30 second Tafel step using a DC pulse train with 1 millisecond period. A mercury/mercurous sulfate reference electrode (marked "ref" in FIG. 3) was used to isolate voltage measurements at the positive and negative electrodes, while case-mounted thermocouples measured the cell temperature via connection 323. Aspects of the experimental apparatus are illustrated in FIG. 3.

Figure 4:
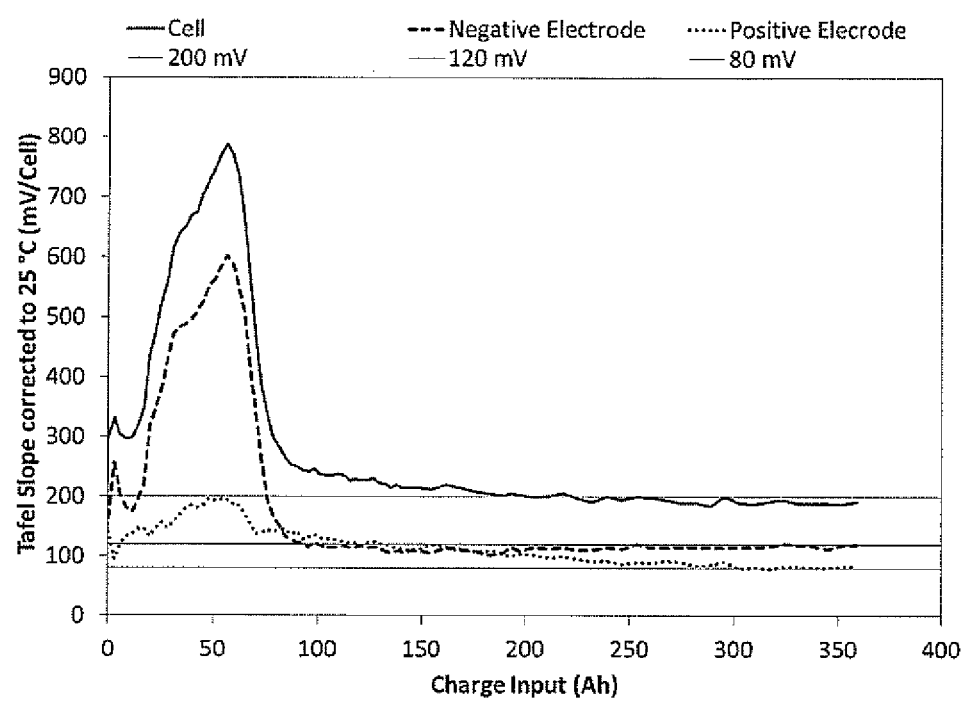
FIG. 4 shows a graph illustrating Example 2 (changing Tafel slope during charge of a lead-acid battery cell: whole cell, solid line; negative electrode, dashed line; positive electrode, dotted line). Gray lines are for reference at 200 mV, 120 mV, and 80 mV.

FIG. 4 shows the changing Tafel slope measured during a constant-current formation charge of a vented lead-acid cell, with isolated trends for the positive and negative electrodes as well as the whole cell. The temperature-corrected Tafel slope throughout the formation is plotted. The large peak in each trend is related to the changing contribution of the main reactions and side reactions to the overall current. After this peak there is a slow decay to a steady-state value. The Tafel slope of the negative electrode is shown to approach the theoretical value for hydrogen evolution (120 mV) relatively quickly while the positive electrode takes much longer to reach the theoretical value of oxygen evolution (80 mV). This indicates that the positive electrode takes longer to reach a full charge than the negative electrode. Overall, the temperature-corrected Tafel slope of the full cell approaches 200 mV, as predicted.

Example 3

Temperature Compensation

Figure 5:
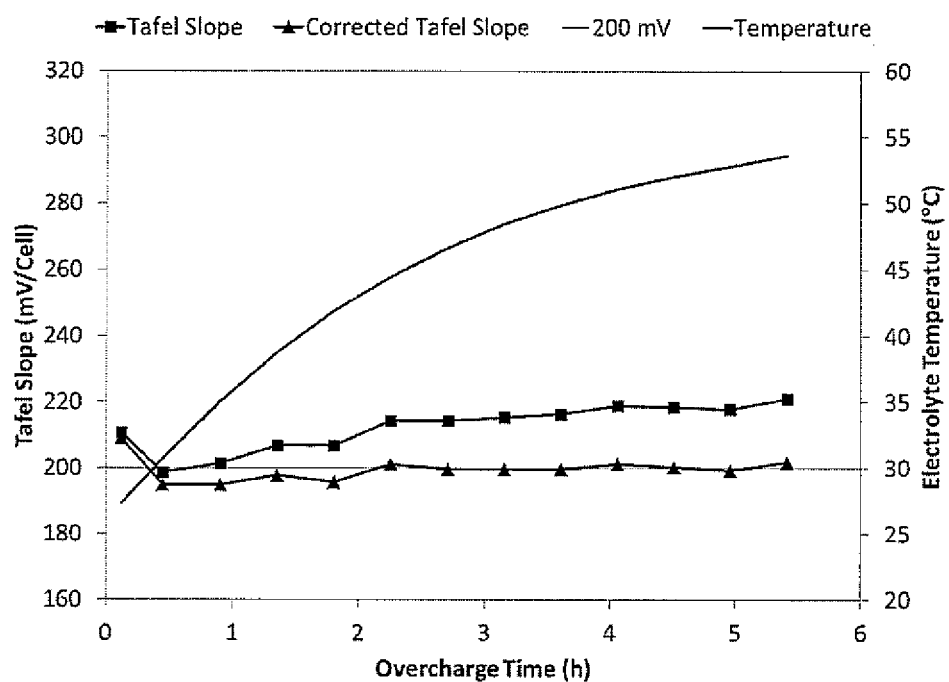
FIG. 5 shows a graph illustrating Example 3 (temperature compensation of Tafel slope).

See FIG. 5. A fully charged flooded lead-acid battery was supplied with 5.5 hours of additional overcharge, all of which should be directed to electrolysis of water since the battery is already charged. The extensive overcharge caused the electrolyte temperature to rise from 27° C. to 54° C. during the 5.5 hour period. As the temperature rose (solid black line, no points), the calculated Tafel slope also rose (solid black line, square points), but this is successfully corrected through application of the temperature compensation method in Eq. (9) with a reference temperature of 25° C. or 298 K. This results in a steady corrected Tafel slope (solid black line, triangle points) of 200 mV (gray reference line) regardless of temperature, which is expected for the electrolysis of water.

Example 4

Tafel Staircase

See FIG. 7, which shows the $R_{xyz}$ determined using Tafel staircase (2 min steps measured throughout; dashed line, triangle points) in comparison to the $R_\Omega$ determined using a 1-millisecond DC pulse train (solid black line, square points), during discharge of a 6-volt flooded lead-acid battery. The two values are in close agreement throughout discharge, indicating that the ohmic component dominates the non-electrochemical resistance. Compare FIG. 8, showing a large divergence of the two trends shortly after the beginning of charge and a re-convergence towards the end of charge. This is explained by the fact that while the discharge consists of a single main electrochemical reaction mechanism, the charge features a mix of parallel electrochemical reactions (the main reaction and the electrolysis side reaction). As the charge voltage increases the side-reaction prevalence increases, and the assumptions associated with the Tafel staircase method breakdown. As the charge nears completion however, the mixed reaction becomes increasingly dominated by the side reaction, and the charge approaches a single-reaction system where the assumptions become valid. FIG. 9 focuses on this region of the charge, showing that the non-electrochemical resistance determined through the Tafel staircase method is in very good agreement with the measured ohmic resistance once the charging process nears completion.

This behaviour also manifests in other methods described herein for determining the Tafel slope. FIG. 10 compares Tafel slope trends measured by a single Tafel step (with independent $R_\Omega$ measurement, as in Example 2) and by a Tafel staircase (with intrinsic $R_{xyz}$ determination). As above, the two methods are in agreement at the beginning of charge, then diverge significantly as the charge voltage rises, before finally converging to the same steady-state value. FIG. 11 focuses on the convergence region, showing that both methods return the expected steady-state Tafel slope of 200 mV, indicating that both methods can be used to detect when the side reactions dominate the charge, and thus when the charge is complete. In this example, the Tafel staircase method only approximates the Tafel step at the beginning of charge (when the electrochemical main reaction dominates) and at the end of charge (when the electrochemical side reaction dominates). The Tafel staircase method approximates the Tafel step method throughout discharge in this example because there is no mix of parallel electrochemical reactions during discharge.

The invention claimed is:

1. A method of determining state-of-charge in a battery comprising:
   measuring a first electrical potential $U_x$ at a first current state $I_x$;
   stepping electrical current to a second current state $I_y$;
   waiting for the electrical potential of the second current state to substantially stabilize;
   once the second current state is substantially stabilized, measuring a second electrical potential $U_y$ corresponding to the second current state $I_y$;
   determining ohmic resistance;
   calculating Tafel slope ($U'_{Tafel}$) of the battery by substituting obtained ohmic resistance, $I_x$, $I_y$, $U_x$, and $U_y$ into a $U'_{Tafel}$ equation requiring ohmic resistance, $I_x$, $I_y$, $U_x$, and $U_y$, respectively; and
   determining state-of-charge by comparing $U'_{Tafel}$ to a predetermined target value of Tafel slope that is characteristic of the battery at that state-of-charge.

2. The method of claim 1 in which the battery exhibits during charging or discharging at least one electrochemical main reaction system and at least one electrochemical side reaction system, and the predetermined target value of Tafel slope is selected from that of the at least one electrochemical side reaction systems.

3. The method of claim 1 in which the battery exhibits during charging or discharging multiple series or parallel electrochemical reaction systems, and the predetermined target value of Tafel slope is that of a predetermined electrochemical reaction system that predominates when the battery is approximately fully charged or approximately fully discharged.

4. The method of claim 1 where ohmic resistance is $R_\Omega$, non-electrical overpotential is $\eta_{xy}$, and Tafel slope is calculated using the equation $$U'_{Tafel} = \frac{U_y - U_x - (I_y - I_x)R_\Omega - \eta_{xy}}{\log\left(\frac{I_y}{I_x}\right)}$$

where $\eta_{xy}$ is assumed to be zero when no estimate is available.

5. The method of claim 1 further comprising:
   after measuring the second electrical potential, stepping electrical current to a third current state $I_z$, waiting for the electrical potential of the third current state to substantially stabilize, and, once the third current state is substantially stabilized,
   measuring a third electrical potential $U_z$ corresponding to the third current state $I_z$;
   wherein
   Tafel slope is calculated using an equation selected from $$U'_{Tafel} = \frac{(U_y - U_x) - (I_y - I_x)R_{xyz}}{\log\left(\frac{I_y}{I_x}\right)},$$

$$U'_{Tafel} = \frac{(U_z - U_y) - (I_z - I_y)R_{xyz}}{\log\left(\frac{I_z}{I_y}\right)},$$

or averages thereof,
and wherein ohmic resistance is $R_{xyz}$ and is calculated using the equation $$R_{xyz} = \frac{(U_y - U_x)\log\left(\frac{I_z}{I_y}\right) - (U_z - U_y)\log\left(\frac{I_y}{I_x}\right)}{(I_y - I_x)\log\left(\frac{I_z}{I_y}\right) - (I_z - I_y)\log\left(\frac{I_y}{I_x}\right)}.$$

6. The method of claim 5 which there is a plurality of current states and a plurality of corresponding electrical potentials and the method comprises stepping to each of the plurality of current states, waiting for the electrical potential of each current state to substantially stabilize, measuring each of the plurality of corresponding electrical potentials, and analogously calculating Tafel slope ($U'_{Tafel}$) of the battery using at least in part equations containing the plurality of current states and the plurality of corresponding electrical potentials.

7. The method of claim 1 in which temperature T is measured shortly before, during, or shortly after the current step sequence, and $U'_{Tafel}$ is corrected for temperature using a reference temperature $T_{ref}$ and the equation $$U'_{Tafel}@T_{ref} = U'_{Tafel}@T\left(\frac{T_{ref}}{T}\right).$$

8. The method of claim 1 in which each waiting is selected from a duration between one second and about 3 seconds, 5 seconds, 10 seconds, 20 seconds, 30 seconds, 1 minute, 2 minutes, 3 minutes, 4 minutes, or 5 minutes of arriving at each current state.

9. The method of claim 8 in which electrical potential is iteratively measured over time while at the second current state, the change in electrical potential over time (dU/dt) is iteratively calculated, and $U_y$ is assigned for that state once dU/dt is less than a cutoff that signifies substantial stabilization, optionally once dU/dt approaches zero.

10. The method of claim 1 in which $I_y$ is selected from a current within about 300%, 200%, 150%, 110%, 90%, 50%, 10%, or 1% of $I_x$.

11. The method of claim 1 in which ohmic resistance is determined during, shortly before, or shortly after stepping using AC injection.

12. The method of claim 11 which ohmic resistance is determined using AC current injection of a frequency between about 1 Hz and about 10 kHz and a current amplitude between about 1 microampere and about 10 amperes.

13. The method of claim 1 in which ohmic resistance is determined during, shortly before, or shortly after stepping using DC current pulse.

14. The method of claim 13 which ohmic resistance is determined by pulsing current from its prevailing current state to a pulsed current state for a duration between about 1 millisecond and about 10 milliseconds, measuring ohmic resistance voltage loss, and optionally, returning current to the prevailing current state.

15. The method of claim 13 which the pulsed current state is selected from a current within about 300%, 200%, 150%, 110%, 90%, 50%, 10%, 1%, or 0% of the prevailing current state.

16. The method of claim 1 in which ohmic resistance is determined by reference to a previously obtained value for ohmic resistance characteristic of the battery.

17. The method according to claim 1 in which the method is iteratively performed and stops when $U'_{Tafel}$ is approximately equal to that of a fully charged battery or to that of an approximately fully charged battery or to that of an approximately fully discharged battery.

18. The method of claim 1 in which ohmic resistance is determined by measuring ohmic resistance voltage loss within about 10 milliseconds of stepping the current from $I_x$ to $I_y$.

19. A system connected to a power source for supplying current to one or more batteries, each battery having a positive terminal and a negative terminal, the system comprising:
a control module having a microprocessor and microprocessor-readable instruction code, wherein the control module is electrically interposed between the power source and one or more output electrical components and controls flow of current to the output electrical components,
each output electrical component being electrically connected to the control module, one of the battery positive terminals of the one or more batteries, and its corresponding battery negative terminal, each forming a circuit between that component and its corresponding battery wherein there are one or more circuits; and
sensors attached to each circuit, wherein the sensors provide information at least indicative of voltage and current in the battery corresponding to that circuit to an analysis module, the analysis module having a microprocessor and microprocessor-readable analysis code;
in which the microprocessor-readable instruction code of the control module has instructions to set the flow of current to a first current state $I_x$ for the one or more batteries and notify the analysis module; the microprocessor-readable analysis code of the analysis module has instructions to, using the sensors, measure the first electrical potential $U_x$ for the one or more batteries at the first current state $I_x$ and notify the control module; the microprocessor-readable instruction code of the control module has further instructions to then step the flow of current for the one or more batteries to a second current state $I_y$ and notify the analysis module; and the microprocessor-readable analysis code of the analysis module has further instructions to then wait until the electrical potential of the second current state substantially stabilizes for each of the one or more batteries, using the sensors measure a second electrical potential $U_y$ corresponding to the second current state $I_y$ once the second current state is substantially stabilized for each of the one or more batteries, determine ohmic resistance for each of the one or more batteries,
calculate Tafel slope ($U'_{Tafel}$) of each of the one or more batteries by substituting obtained ohmic resistance, $I_x$, $I_y$, $U_x$, and $U_y$ into a $U'_{Tafel}$ equation requiring ohmic resistance, $I_x$, $I_y$, $U_x$, and $U_y$, respectively, and
compare $U'_{Tafel}$ to a predetermined target value of Tafel slope that is characteristic of each of the one or more batteries at that state-of-charge to determine whether a state-of-charge criterion has been met for each of the one or more batteries.

20. A non-transitory computer medium having encoded thereon computer program code that is executable by a processor and that, when executed by the processor, causes the processor to determine Tafel slope and state-of-charge by operating a state-of-charge system having voltage and current sensors attached to a battery, in which Tafel slope and state-of-charge are determined according to a method comprising:
measuring a first electrical potential $U_x$ at a first current state $I_x$; stepping electrical current to a second current state $I_y$; waiting for the electrical potential of the second current state to substantially stabilize; once the second current state is substantially stabilized, measuring a second electrical potential $U_y$ corresponding to the second current state $I_y$; determining ohmic resistance; calculating Tafel slope ($U'_{Tafel}$) of the battery by substituting obtained ohmic resistance, $I_x$, $I_y$, $U_x$, and $U_y$ into a $U'_{Tafel}$ equation requiring ohmic resistance, $I_x$, $I_y$, $U_x$, and $U_y$, respectively; and determining state-of-charge by comparing $U'_{Tafel}$ to a predetermined target value of Tafel slope that is characteristic of the battery at that state-of-charge.

* * * * *